(12) United States Patent
Bhattacharya et al.

(10) Patent No.: US 10,664,563 B2
(45) Date of Patent: May 26, 2020

(54) CONCURRENT TESTBENCH AND SOFTWARE DRIVEN VERIFICATION

(71) Applicant: Mentor Graphics Corporation, Wilsonville, OR (US)

(72) Inventors: Debdutta Bhattacharya, Fremont, CA (US); Ayub Akbar Khan, Fremont, CA (US); Charles W. Selvidge, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 40 days.

(21) Appl. No.: 15/943,423

(22) Filed: Apr. 2, 2018

(65) Prior Publication Data

US 2018/0285484 A1 Oct. 4, 2018

Related U.S. Application Data

(60) Provisional application No. 62/480,470, filed on Apr. 2, 2017.

(51) Int. Cl.
*G06F 17/50* (2006.01)

(52) U.S. Cl.
CPC ........ *G06F 17/504* (2013.01); *G06F 17/5027* (2013.01); *G06F 17/5054* (2013.01)

(58) Field of Classification Search
CPC .... G06F 9/455; G06F 17/5027; G06F 11/261; G06F 11/263; G06F 17/5022; G06F 17/5054; G06F 2217/12; G06F 17/504; G06F 17/5045
USPC .................................................. 716/106, 136
See application file for complete search history.

(56) References Cited

U.S. PATENT DOCUMENTS

| 6,785,873 B1 * | 8/2004 | Tseng .................. G06F 17/5022 716/102 |
| 9,697,324 B1 * | 7/2017 | Rajan ...................... G06F 9/455 |
| 2015/0040096 A1 * | 2/2015 | Chang ................. G06F 17/5027 716/136 |

* cited by examiner

*Primary Examiner* — Paul Dinh

(57) ABSTRACT

A verification system comprises: a reconfigurable hardware modeling device programmed to implement a hardware model of a circuit design; a first computing unit configured to execute a first software program; and a second computing unit configured to execute a testbench model of a second software program. The execution of the first software program and the testbench model of the second software program generates first stimuli and second stimuli for an operation of the hardware model of the circuit design, respectively. The first stimuli and the second stimuli are transmitted to the hardware model of the circuit design through a communication interface.

23 Claims, 11 Drawing Sheets

CONCURRENT TESTBENCH AND SOFTWARE DRIVEN VERIFICATION

RELATED APPLICATIONS

This application claims the benefit of U.S. Provisional Patent Application No. 62/480,470, filed on Apr. 2, 2017, and naming Debdutta Bhattacharya et al. as inventors, which application is incorporated entirely herein by reference.

FIELD OF THE DISCLOSED TECHNOLOGY

The present disclosed technology relates to the field of circuit design verification technology. Various implementations of the disclosed technology may be particularly useful for hardware/software co-verification or integration.

BACKGROUND OF THE DISCLOSED TECHNOLOGY

Electronic circuits, such as integrated circuits, are used in a variety of products, from automobiles to smart phones to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators/prototyping devices. The verification processes then are used to identify and correct errors in the design.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Description Language (HDL) (sometimes also referred to as hardware design language or hardware definition language), such as the Very high speed integrated circuit Hardware Description Language (VHDL) or the Verilog language. The logic of the circuit is then analyzed, to confirm that the logic incorporated into the design will accurately perform the functions desired for the circuit. This analysis is sometimes referred to as "functional verification."

Logic simulation is a tool used for functional verification. Designing hardware today involves writing a program in the hardware description language. A simulation may be performed by running that program on a computer. Such an electronic design simulator can determine what the various states of an electronic design would be when presented with some input stimulus. Simulators are commercially available such as the QUESTA family of simulators from Mentor Graphics Corporations of Wilsonville, Oreg.

Software-based simulation, however, may be too slow for large complex designs such as SoC (System-on-Chip) designs. The speed of execution of a simulator drops significantly as the design size increases due to cache misses and memory swapping. Emulation and prototyping significantly increase verification productivity by employing reconfigurable hardware modeling devices including emulators and prototyping devices. Field programmable gate arrays (FPGAs)-based emulators and prototyping devices rely on an actual silicon implementation and perform circuit verification generally in parallel as the circuit design will execute in a real device. By contrast, a simulator performs circuit verification by executing the hardware description code serially. The different styles of execution can lead to orders of magnitude differences in execution time. Examples of hardware emulators include the VELOCE family of emulators available from Mentor Graphics Corporation of Wilsonville, Oreg., the ZEBU family of emulators available from Synopsys, Inc. of Mountain View, Calif., and the PALLADIUM family of emulators available from Cadence Design Systems of San Jose, Calif.

The verification processes may also include debugging software programs. Today's system-on-chip (SoC) designs aren't just hardware anymore. Modern devices are delivered with significant amounts of software, including software stacks, middleware, boot code, and drivers. In the past, the creation of hardware circuit chips was separate from the creation of the software to be executed on those circuit chips, but today a SoC isn't complete until the intended software has been proven to work—and to work well—on the platform. A reconfigurable hardware modeling device such as an emulator or an FPGA prototyping device provides a clock cycle accurate model of a circuit design, enabling detailed timing analysis and accurate determination of throughput, latencies and response times. It can thus be used to build an environment for validating various aspects of the system prior to obtaining physical silicon.

For a system to produce a result or achieve a goal, several software programs are often needed to work together or in tandem. For example, one software program initializes the circuit while another software program provide stimuli for the circuit to perform a function. Under conventional technologies, a software program in a software stack cannot be executed and debugged in a reconfigurable hardware modeling device-based environment until all other software programs in the same software stack are completed. This can prolong the overall verification process. Moreover, hardware verification engineers also need to be able to model the impact of software as it interacts with the hardware. Software testbench models can replace software programs by generating the stimuli for circuit models in some circumstances. However, many software programs cannot be abstracted into testbench models. New technologies are needed to address these challenges so that software development can start at earlier stages and circuit designs can be can be taped out earlier.

BRIEF SUMMARY OF THE DISCLOSED TECHNOLOGY

Aspects of the disclosed technology relate to techniques for concurrent testbench and software driven verification. In one aspect, there is a system, comprising: a reconfigurable hardware modeling device programmed to implement a hardware model of a circuit design; a first computing unit configured to execute a first software program, the execution of the first software program generating first stimuli for an operation of the hardware model of the circuit design; and a second computing unit configured to execute a testbench model of a second software program, the execution of the testbench model generating second stimuli for the operation of the hardware model of the circuit design, wherein the first stimuli and the second stimuli are transmitted to the hardware model of the circuit design through a communication interface.

The communication interface may comprise a speed bridge device or a transactor. The transactor comprises a front-end proxy interface implemented in a computer and a back-end bus-functional model implemented in the reconfigurable hardware modeling device. The front-end proxy interface may comprises: a first sub-interface unit communicating with the first computing unit, the communicating with the first computing unit comprising receiving the first stimuli; and a second sub-interface unit communicating with the second computing unit, the communicating with the second computing unit comprising receiving the second stimuli. The first computing unit may also be implemented by the same computer.

The first computing unit may further be configured to execute a software model of a processor. The processor is an embedded processor in an embedded system configured to execute software programs comprising the first software program and the second software program. The embedded system further comprises a chip comprising a circuit manufactured based on the circuit design.

The first computing unit may further be configured to execute a testbench interface program communicating with the testbench model. The communication comprises receiving the second stimuli. Alternatively, the first software program may comprise a testbench interface module communicating with the testbench model, which comprises receiving the second stimuli.

The first computing unit and the second computing unit may be implemented by a single computer, or by two computers, respectively. The first computing unit may be implemented using a virtual machine running on a computer. The second computing unit may comprises: a virtual machine interface program communicating with the virtual machine, the communicating comprising sending the second stimuli; and a stimuli generation program configured to generate the second stimuli.

The reconfigurable hardware modeling device may be a hardware emulator or an FPGA-based prototyping device. The first computing unit, the second computing unit, or both, may receive circuit responses from the hardware model of the circuit design through the communication interface.

In another aspect, there is a method, comprising: implementing a hardware model of a circuit design on a reconfigurable hardware modeling device, the reconfigurable hardware modeling device and a computing environment having a communication interface, the computing environment comprising a first computing unit and a second computing unit; generating first stimuli by executing a first software program on the first computing unit; and generating second stimuli by executing a testbench model of a second software program on the second computing unit, wherein the first stimuli and the second stimuli are transmitted through the communication interface to the hardware model of the circuit design for an operation of the hardware model of the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1A:
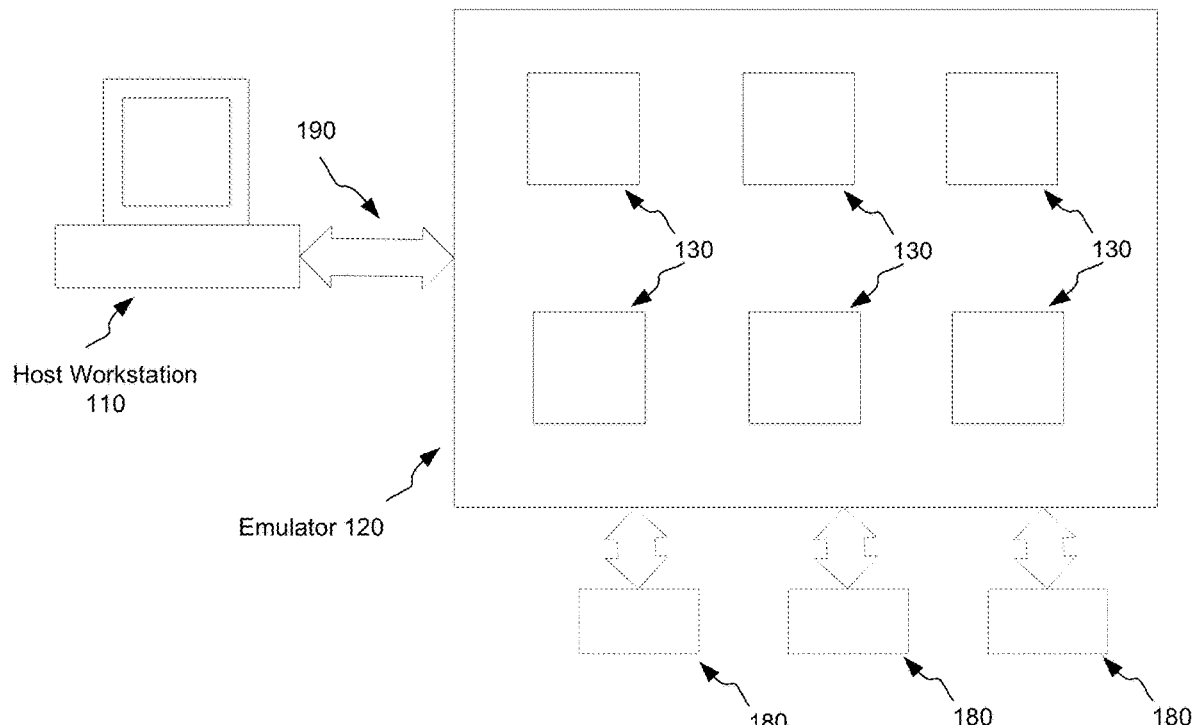
FIG. 1A shows an illustrative example of an emulation system with an emulator being coupled to targets.

Various aspects of the present disclosed technology relate to techniques for concurrent testbench and software driven verification. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "configure", "generate" and "merge" to describe the disclosed methods/systems. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Hardware Modeling Environment

Reconfigurable hardware modeling devices can be emulators or prototyping devices. Two types of emulators have been developed. The first type is FPGA-based. In an FPGA-based architecture, each FPGA chip has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route are performed on the FPGA chips in a way that preserves the connectivity in the original circuit design.

The programmable logic chips employed by an emulator may be commercial FPGA chips or custom-designed emulation chips containing programmable logic blocks. A custom FPGA-based emulator can have a specially designed internal interconnection network of programmable elements within each custom FPGA, an external interconnecting network and I/O structure of custom FPGAs, and a design-under-test debug engine. Such architecture enables, compared to a commercial FPGA-based counterpart, fast and correct-by-construction compilation and high design visibility in the silicon fabric that assumes 100% access without probe compilation and rapid waveform tracing. A commercial FPGA chip may have somewhat larger capacity density than a custom FPGA chip. For a given design, a custom FPGA-based emulator may need more FPGAs than a commercial FPGA-based emulator, leading to larger physical dimensions and higher power consumption.

The second type of emulators is processor-based: an array of Boolean processors able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. The compilation speed of a processor-based emulator, however, is much faster than those of a FPGA-based emulator. Drawbacks are limited speed of execution in a transaction-based mode, large power consumption, and large physical dimensions compared to a FPGA-based emulator.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is often not fast enough to run at the same speed of the physical target system (a few megahertz vs hundreds of megahertz). Speed rate adapters may be introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols may make timely rate adapter development difficult.

In an acceleration mode, the physical target system is replaced by a virtual target system modelled via one of the high-level languages such as SystemVerilog, SystemC, or C++. The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange is through so-called transactors. A transactor, including a front-end proxy interface on the workstation or host computer, a back-end bus-functional model on the emulator and a physical communication channel between the host computer and the emulator, converts high-level commands from the testbench on the host computer into signal-level bit sequences required by the design-under-test model on the emulator, and vice versa. This allows data being streamed and buffered between the testbench and the design-under-test, speeding up the execution of the testbench. A design team can thus access the full performance of the emulator. In addition to performance, the transaction-based emulation eliminates the need for rate adapters. The design-under-test can connect to a "virtual device" (a software model of the device) that runs on the host computer through a transaction-level interface or to a physical device through a transaction-level interface and a "virtual device" acting as a bridging device.

In addition to emulators, reconfigurable hardware modeling devices also include FPGA prototyping devices. FPGA prototyping is typically deployed near the end of the verification process to catch system-level issues. For designs that rely heavily on commercial intellectual property (IP), an FPGA-based prototype is an ideal test platform for ensuring all IP components perform together. An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Compared to FPGA-based emulators which typically operate at one to two million cycles per second, FPGA prototypes are designed and built to achieve the highest speed of execution possible, allowing the extension of the speed range into tens of megahertz. The downside to FPGA prototyping is capacity limitations, limited debugging capabilities and long bring-up time. With growing complexity of FPGAs and advancement in both emulation and prototyping technologies, the lines between FPGA-based prototyping and emulation are increasingly blurring.

In some embodiments, the disclosed technology may be implemented as part of a hardware emulation environment, such as the one illustrated in FIG. 1A. As seen in this figure, the hardware emulation environment includes an emulator 120 coupled to a host computer or workstation 110. The workstation 110 may be implemented by one or more computing systems. One computing system may include a single computer or multiple computers (e.g., a master computer and a plurality of slave computers). The workstation provides the capability to load the DUV (design-under-verification, also referred to as DUT—design under test) model into the emulator, controls the execution of the DUT model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the workstation 110 and loaded to the emulation circuit boards 130 for emulation.

In the in-circuit emulation mode, one or more targets 180 may be coupled to the emulator 120 as shown in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
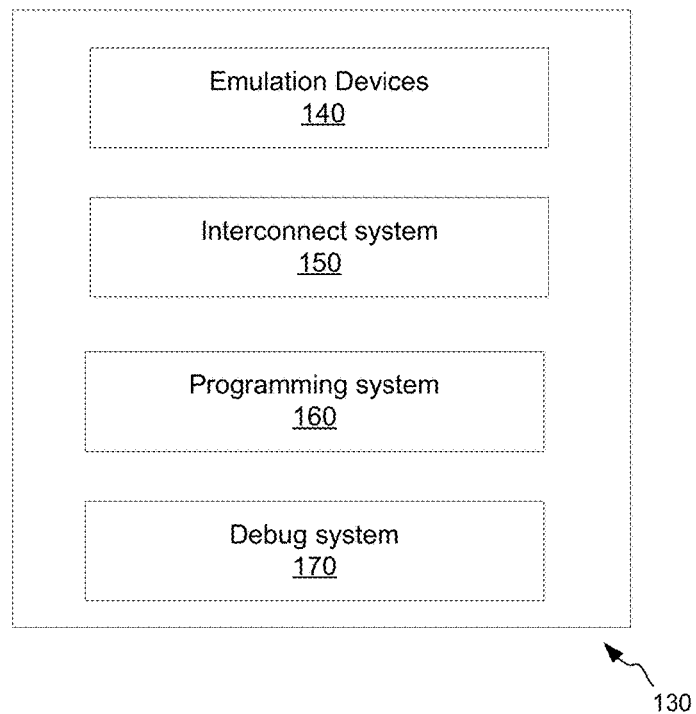
FIG. 1B shows an illustrative example of an emulation circuit board.

FIG. 1B illustrates an example of an emulation circuit board 130. The emulation circuit board 130 includes an array of emulation devices 140. The emulation devices 140 can be programmed to model, for example, combinatorial logic components, sequential circuit components and memories. The emulation devices 140 may be processor-based or FPGA-based.

Also included in the emulation circuit board 130 are a configurable interconnect system 150, a programming system 160, and a debug system 170. A portion of a circuit design on one emulation device may need data computed by another portion of the design on another emulation device. The configurable interconnect system 150 allows data to be moved between emulation devices 140. In some implementations, the configurable interconnect system 150 may include a cross-bar device, a multiplexer, some other configurable network, or any combination thereof.

The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140.

The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model (e.g., FPGA configuration bitstreams), initial contents of registers and design memories and data for debugging purposes. This interface is independent of design-under-test and may comprise dedicated logic or programmed logic in the emulator.

The interface system may also comprise one or more transaction-level interfaces. These interfaces may be optimized for small packets of data and fast streaming speed. The speed may be, for example, in the order of 2-3 Gigabits per second. The communication is performed through transactors as discussed previously. A transactor includes a back-end bus-functional model—instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Illustrative Computer-Based Operating Environment

Figure 2:
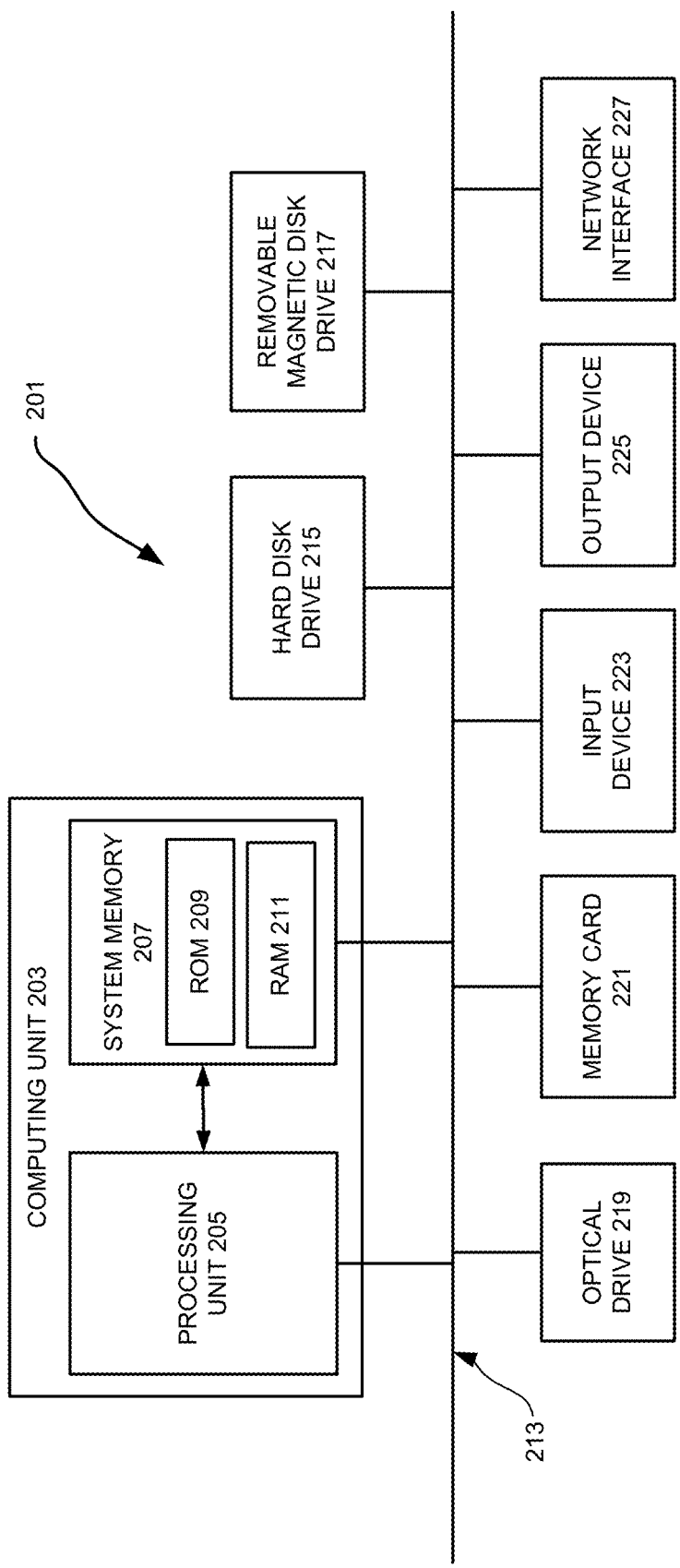
FIG. 2 illustrates a programmable computer system with which various embodiments of the disclosed technology may be employed.

FIG. 2 shows an illustrative example of a computing device 201 which may serve as the workstation 110 and/or implement various embodiments of a part or whole of the disclosed technology. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 103 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and it not intended to be limiting. Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multiprocessor computer, a plurality of single and/or multiprocessor computers arranged into a network, or some combination of both.

Concurrent Testbench and Software Driven Verification

Figure 3A:
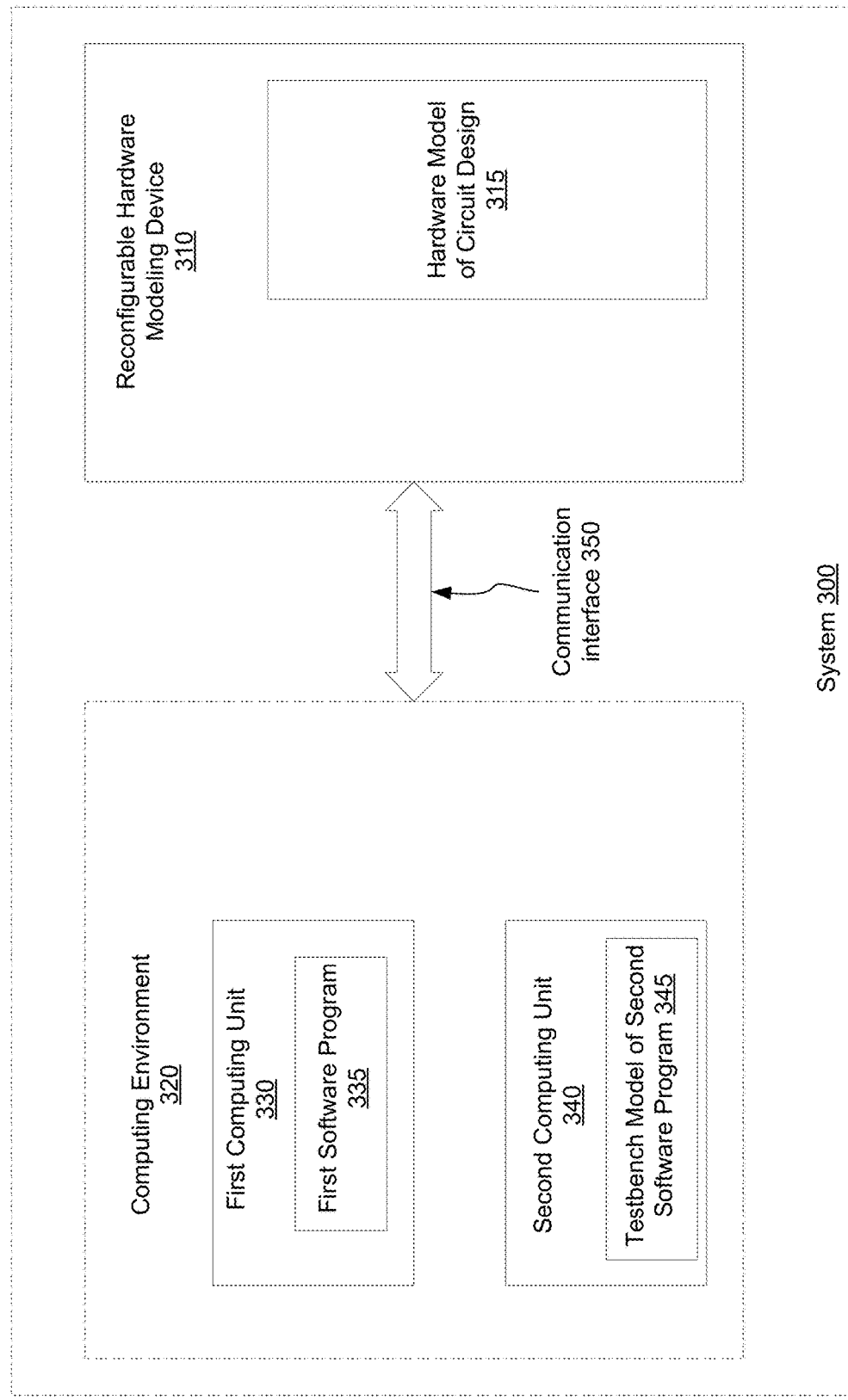
FIG. 3A illustrates an example of a verification system that may be employed by various embodiments of the disclosed technology.

FIG. 3A illustrates an example of a verification system 300 that may be employed by various embodiments of the disclosed technology. The verification system 300 comprises a reconfigurable hardware modeling device 310, a computing environment 320 and a communication interface 350 between the reconfigurable hardware modeling device 310 and the computing environment 320. The reconfigurable hardware modeling device 310 comprises a hardware model of a circuit design 315. The computing environment 320 comprises a first computing unit 330 and a second computing unit 340. The first computing unit 330 is configured to execute a first software program 335 while the second computing unit is configured to execute a testbench model of a second software program 345. The execution of the first software program 335 and the testbench model of the second software program 345 can generate first stimuli and second stimuli, respectively. The first stimuli and the second stimuli are transmitted to the reconfigurable hardware modeling device 310 through the communication interface 350 for an operation of the hardware model of a circuit design 315. Circuit responses from the hardware model of the circuit design 315 may be transmitted through the communication interface back to the first computing unit 330, the second computing unit 340, or both.

The reconfigurable hardware modeling device 310 may be a hardware emulator or an FPGA-based prototyping device. The hardware emulator may be processor-based, commercial FPGA-based or custom FPGA-based. The reconfigurable hardware modeling device 310 may be programmed by bit streams to implement the hardware model of the circuit design 315. The bit streams may be generated by a compiler based on the circuit design. The circuit design may be in the form of a register transfer level (RTL) description and coded by hardware description language (HDL). The circuit design may represent a whole or part of a circuit. For the circuit to perform the operation, both the first stimuli and the second stimuli are needed. The circuit may be a network switch, for example. The second software program may program the network switch to transmit data and the first software program may perform DMA (direct memory access) data transfer.

The first computing unit 330, the second computing unit 340, and part of the communication interface 350 may be implemented in a single computer. Alternatively, any two of them may be implemented in a single computer while the third is implemented in a different computer. In still another embodiment, three computers may be employed to implement the first computing unit 330, the second computing unit 340, and the part of the communication interface 350, respectively. The first computing unit 330 may be implemented using a virtual machine such as QEMU (quick emulator) running on a computer. The virtual machine provides a platform-independent programming environment and allows the first software program 335 to execute in the same way on any platform. The testbench model of the second software program 345 may be written using a hardware verification language such as SystemVerilog or System C.

It should be appreciated by a person of ordinary skill in the art that one or more other software programs may also provide additional stimuli to the hardware model of the circuit design 315 for the operation. Some or all of the one or more other software programs may be executed by the first computing unit 330 or additional computing unit(s). Some or all of the one or more other software programs may also be abstracted by testbench models which are executed by the second computing unit 340 or by additional computing unit(s).

Figure 3B:
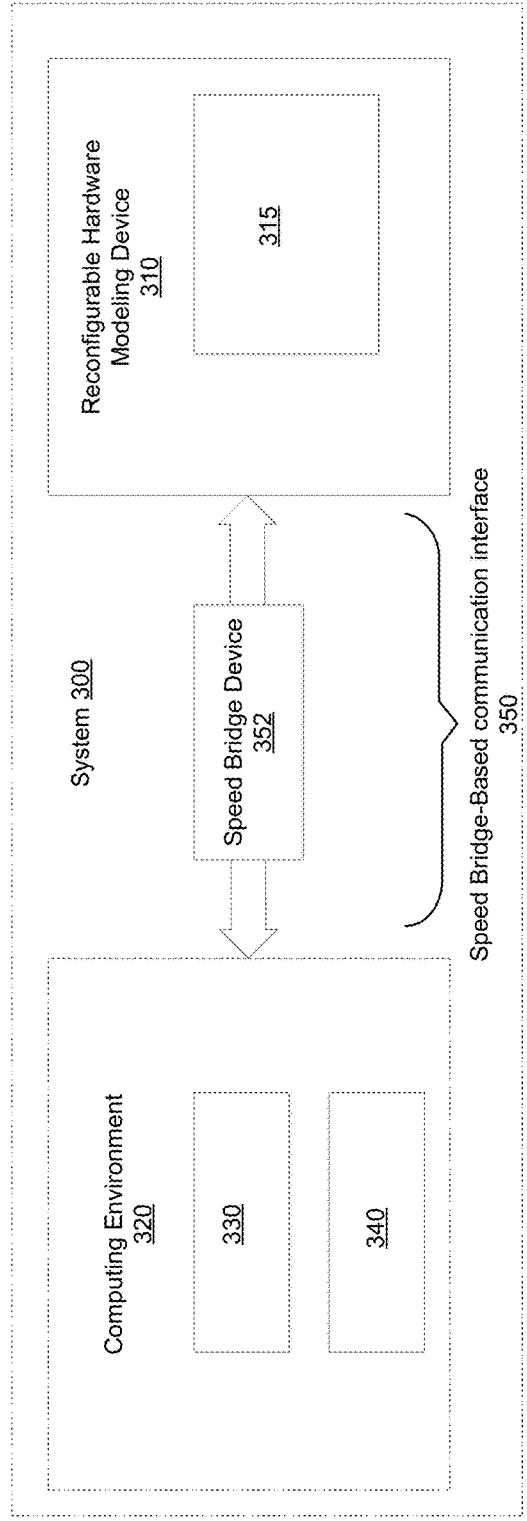
FIG. 3B illustrates an example of a verification system in which the communication interface comprises a speed bridge device according to some implementations of the disclosed technology.

FIG. 3B illustrates an example of a verification system 300 in which the communication interface 350 comprises a speed bridge device 352 according to some implementations of the disclosed technology. As noted previously, the speed bridge device 352 can compensate for the speed differences between the computing environment 320 and the reconfigurable hardware modeling device 310. A speed bridge is sometimes also referred to as a speed-rate adapter.

Figure 3C:
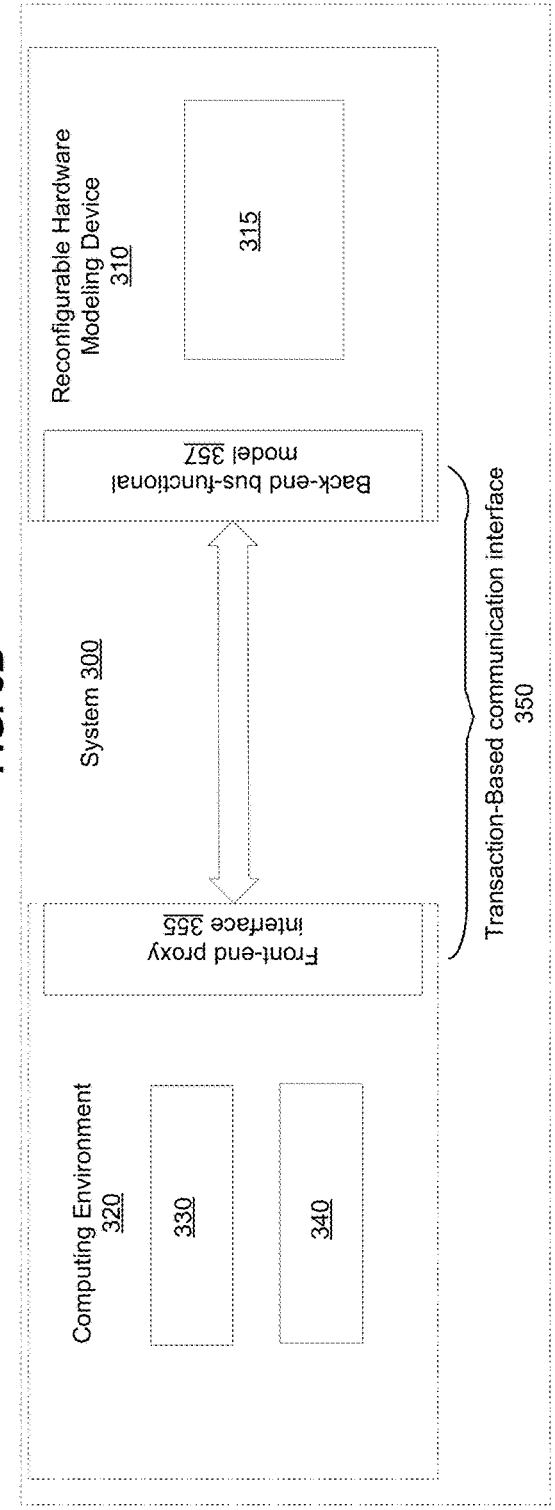
FIG. 3C illustrates an example of a verification system in which the communication interface comprises a transactor according to some other implementations of the disclosed technology.

FIG. 3C illustrates an example of a verification system 300 in which the communication interface 350 comprises a transactor according to some other implementations of the disclosed technology. The transactor in the figure comprises a front-end proxy interface 355 in the computing environment 320 and a back-end bus-functional model 357 in the reconfigurable hardware modeling device 310. The front-end proxy interface 355 may be written at a higher level of abstraction than RTL and interface with the first computing unit 330, the second computing unit 340 or both. The back-end bus-functional model 357 may be written in HDL code and be mapped onto the reconfigurable hardware modeling device 310. It may include various behavioral constructs, such as implicit state machines that control input/output pin transitions of the hardware model of the circuit design 315, behavioral clock and reset generation, and tasks that can be synthesized onto the reconfigurable hardware modeling device 310. The communication between the front-end proxy interface 355 and the back-end bus-functional model 357 can be multi-cycle transactions instead of signal-level transitions.

Figure 4B:
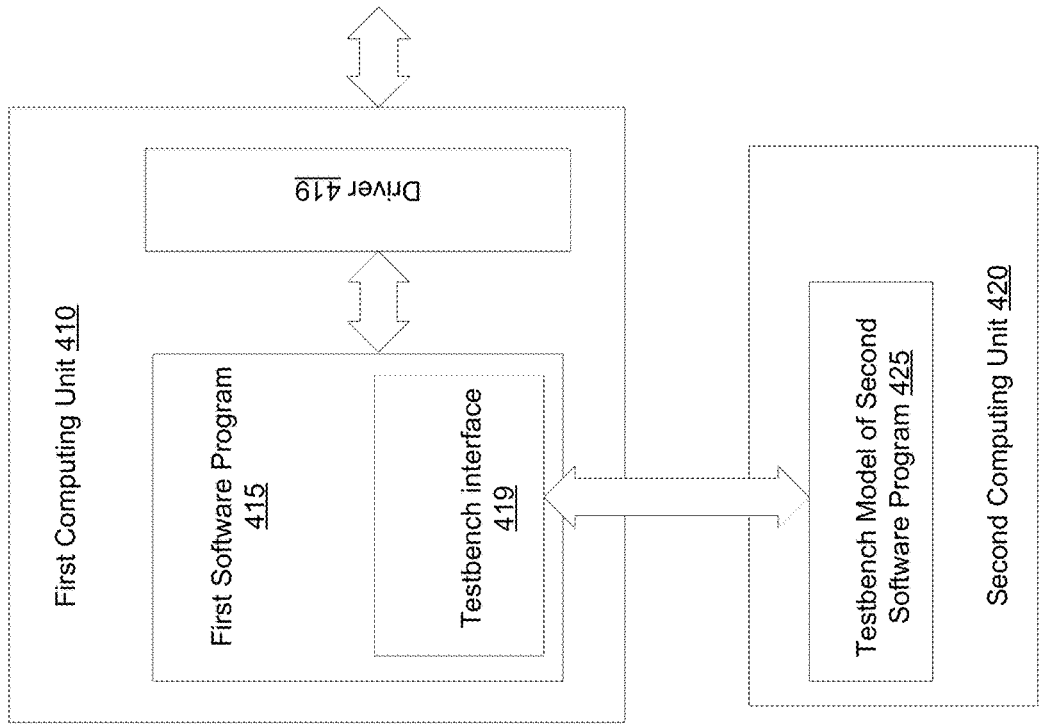
FIG. 4B illustrates another example of how the first stimuli generated by the first software program and the second stimuli generated by the testbench model of the second software program are merged prior to being transmitted to the hardware model of the circuit design according to some other embodiments of the disclosed technology.
Figure 4A:
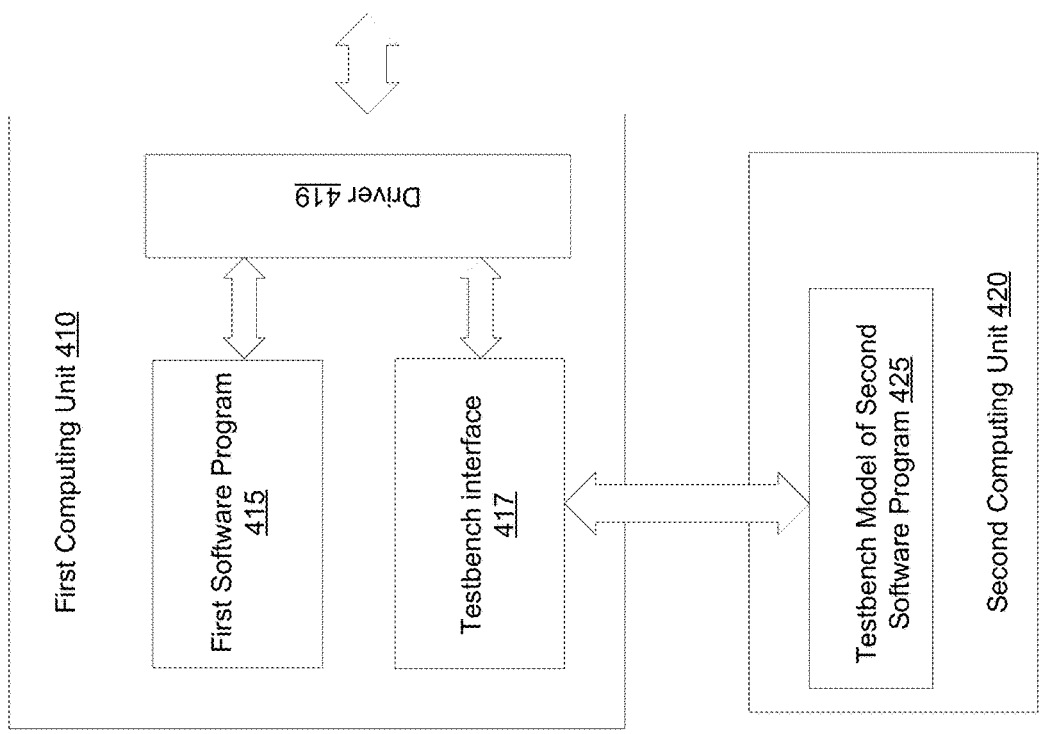
FIG. 4A illustrates an example of how the first stimuli generated by the first software program and the second stimuli generated by the testbench model of the second software program are merged prior to being transmitted to the hardware model of the circuit design according to some embodiments of the disclosed technology.

FIG. 4A illustrates an example of how the first stimuli generated by the first software program 415 and the second stimuli generated by the testbench model of the second software program 425 are merged prior to being transmitted to the hardware model of the circuit design according to some embodiments of the disclosed technology. In this example, the first computing unit 410 is further configured to execute a testbench interface program 417. The testbench interface program 417 communicates with the testbench model of the second software program 425. The communication comprises receiving the second stimuli. The testbench interface program 417 then provides the second stimuli to a driver 419, which also receives the first stimuli from the first software program 415.

FIG. 4B illustrates another example of how the first stimuli generated by the first software program 415 and the second stimuli generated by the testbench model of the second software program 425 are merged prior to being transmitted to the hardware model of the circuit design according to some other embodiments of the disclosed technology. Rather than using a separate interface program 417, the first software program 415 comprises a testbench interface module 419 for receiving the second stimuli. Both the first stimuli and the second stimuli are sent to the driver 419 by the first software program 415.

Figure 4C:
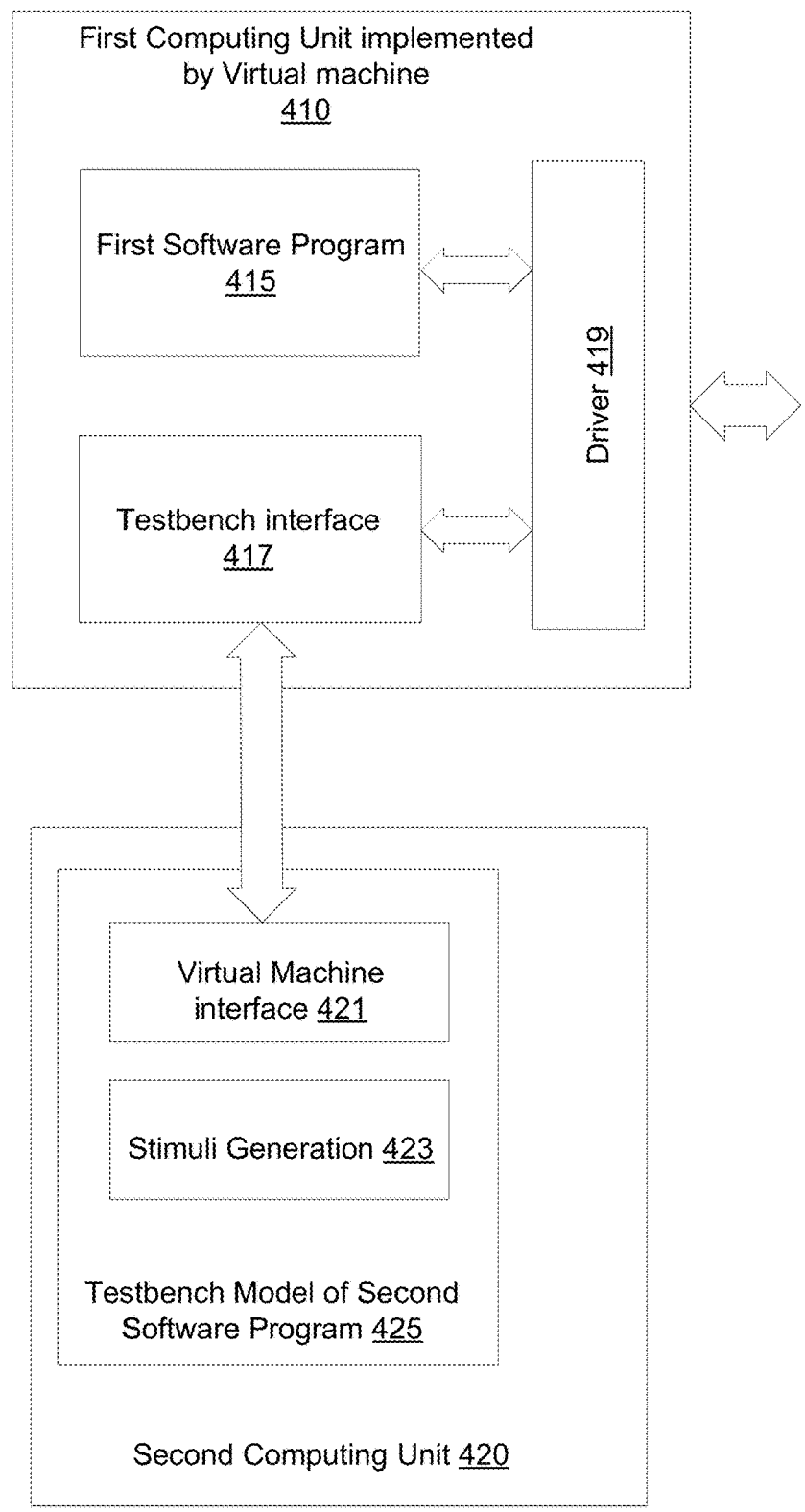
FIG. 4C illustrates an example of the testbench model of the second software program which comprises a virtual machine interface program.

As noted previously, the first computing unit may be implemented by a virtual machine running on a computer. The testbench model of the second software program may comprise a virtual machine interface program communicating with the virtual machine. The communicating comprises sending the second stimuli. FIG. 4C illustrates such an example. In the figure, the testbench model of the second software program 425 comprises a virtual machine program 421 and a stimuli generation program 423. The stimuli generation program 423 generates the second stimuli. The virtual machine program 421 sends the second stimuli to the testbench interface program 417, which communicate the second stimuli to the driver 419. The first computing unit 410 in FIG. 4C has a structure similar to the one shown in FIG. 4B. A person of ordinary skill in the art would appreciate that the first computing unit 410 may employ a different structure such as the one shown in FIG. 4A.

Figure 5:
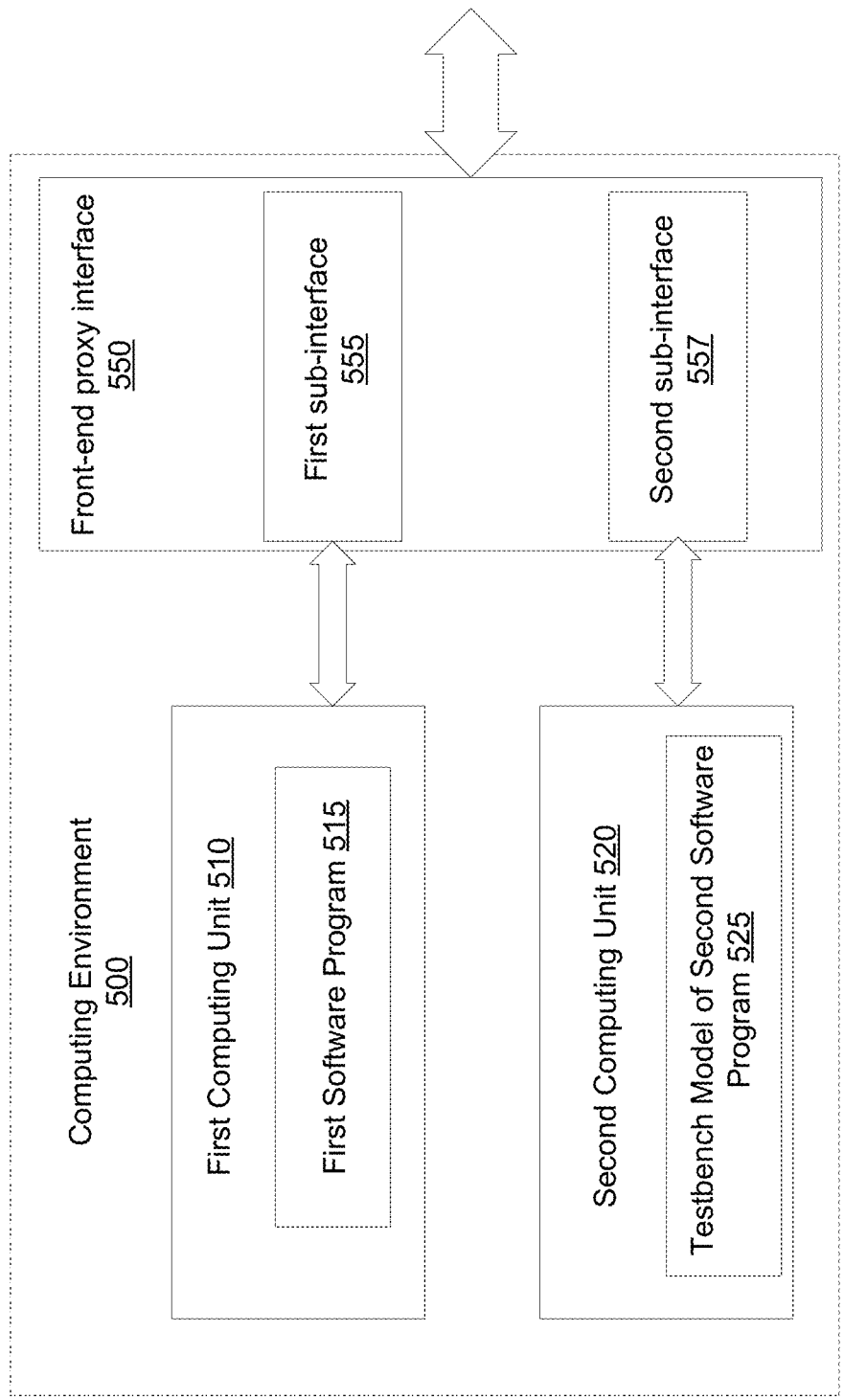
FIG. 5 illustrates a third example of how the first stimuli generated by the first software program and the second stimuli generated by the testbench model of the second software program are merged prior to being transmitted to the hardware model of the circuit design according to still some other embodiments of the disclosed technology.

FIG. 5 illustrates a third example of how the first stimuli generated by the first software program and the second stimuli generated by the testbench model of the second software program are merged prior to being transmitted to the hardware model of the circuit design according to still some other embodiments of the disclosed technology. In this third example, the front-end proxy interface 550 of the transactor communicates with the first computing unit 510 through a first sub-interface unit 555 and with the second computing unit 520 through a second sub-interface unit 557. As such, the first stimuli generated by executing the first software program 515 and the second stimuli generated by executing the testbench model of the second software program 525 are merged in the front-end proxy interface 550.

Figure 6:
FIG. 6 illustrates an example of the first computing unit which comprises a software model of an embedded processor according to some embodiments of the disclosed technology.

Embedded systems, electronic systems that use microcontrollers (MCUs) or microprocessors (MPUs), are employed in cars, planes, trains, space vehicles, machine tools, cameras, consumer electronics, office appliances, network appliances, cellphones, GPS navigation as well as robots and toys. To perform hardware verification and software validation, a circuit used in an embedded system may be synthesized into a HDL model running on a reconfigurable hardware modeling device while an embedded processor may be represented by a behavior model running on a computer. An embedded software under development may be executed on the same computer. FIG. 6 illustrates such an example. The first computing unit 610 is configured to execute a software model of an embedded processor 620 and to execute a first software program 630. This configuration of the first computing unit may be employed by the first computing unit shown in FIGS. 3A-3C, 4A-4C, and 5.

Figure 7:
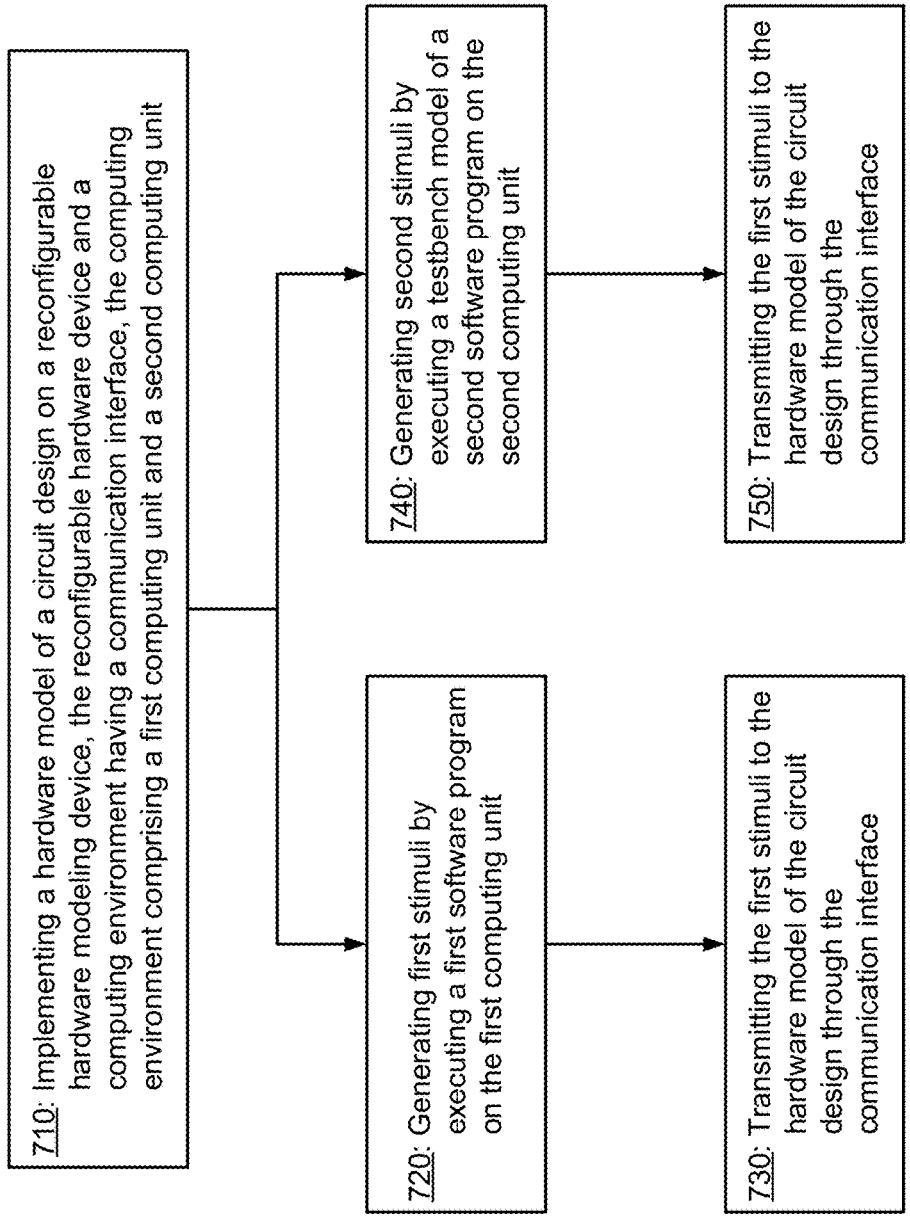
FIG. 7 illustrates a flowchart showing a concurrent testbench and software driven verification process that may be implemented according to various examples of the disclosed technology.

FIG. 7 illustrates a flowchart 700 showing a concurrent testbench and software driven verification process that may be implemented according to various examples of the disclosed technology. For ease of understanding, methods of concurrent testbench and software driven verification that may be employed according to various embodiments of the disclosed technology will be described with reference to the verification system 300 in FIG. 3A and the flow chart 700 illustrated in FIG. 7. It should be appreciated, however, that alternate implementations of a verification system 300 may be used to perform the methods of concurrent testbench and software driven verification illustrated by the flow chart 700 according to various embodiments of the disclosed technology. Likewise, the verification system 300 may be employed to perform other methods of concurrent testbench and software driven verification according to various embodiments of the disclosed technology.

In operation 710 of the flowchart 700, the reconfigurable hardware modeling device 310 is programmed to implement the hardware model of the circuit design 315. In operation 720, the first computing unit 330 executes the first software program 335. The execution of the first software program 335 generates the first stimuli. In operation 730, the first stimuli are transmitted to the reconfigurable hardware modeling device 310 through the communication interface 350 for an operation of the hardware model of the circuit design 315. In operation 740, the second computing unit 340 executes the testbench model of the second software program 345. The execution of the testbench model of the second software program 345 generates the second stimuli. In operation 750, the second stimuli are transmitted to the reconfigurable hardware modeling device 310 through the communication interface 350 for the operation of the hardware model of the circuit design 315. It should be noted that while the above operations are presented in a particular order, the operations may be performed concurrently or in a different sequence.

Figure 8:
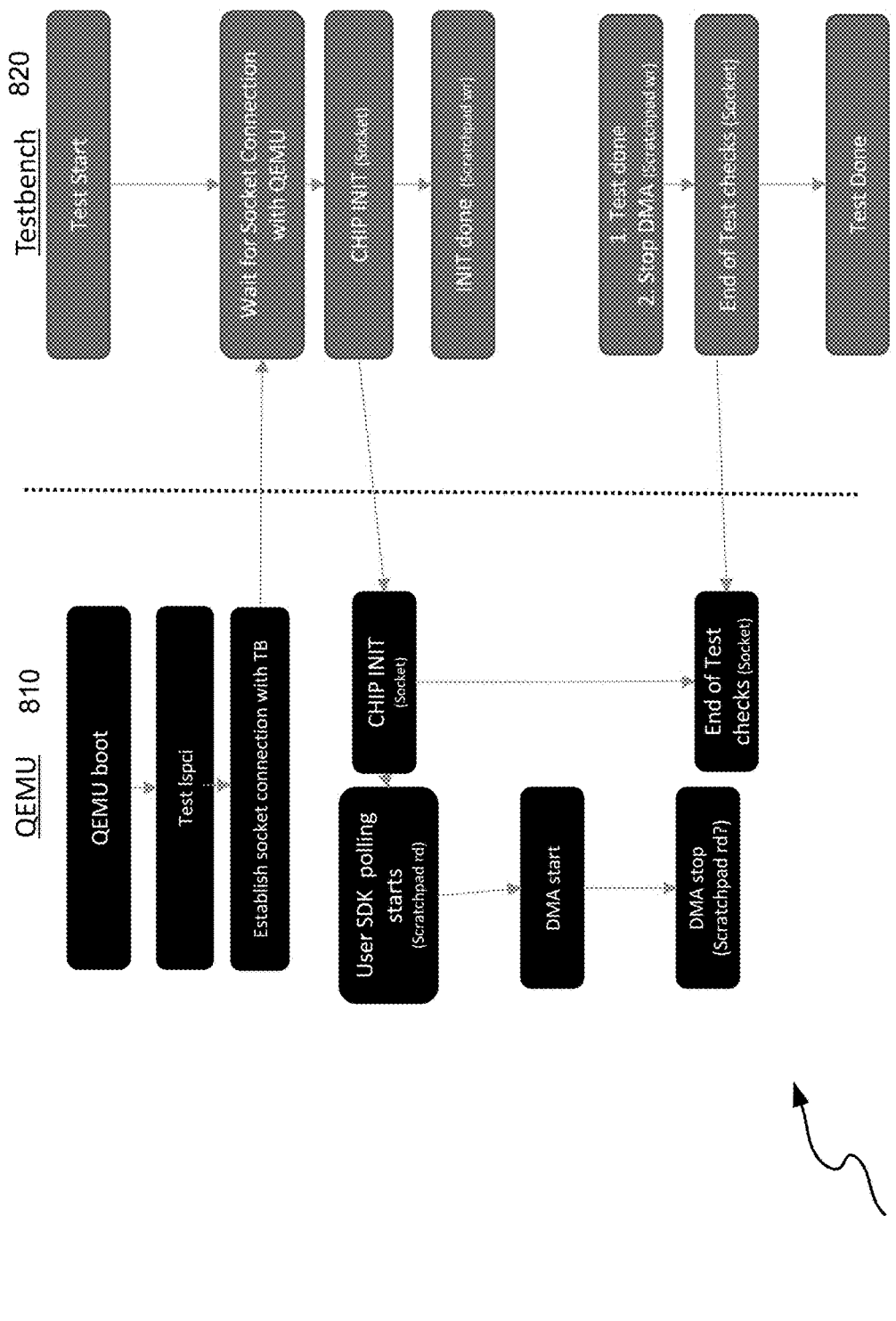
FIG. 8 illustrates a flowchart showing a specific example of concurrent testbench and software driven verification.

FIG. 8 illustrates a flowchart 800 showing a specific example of concurrent testbench and software driven verification. The flowchart has two concurrent processes, a QEMU process 810 and a testbench process 820. The testbench process 820 execute a software testbench model which initializes the design-under-test (DUT) running on an emulator and also determines whether a test is finished or not. The QEMU process 810 executes a software program in a virtual machine environment which performs DMA data transfer. As the flowchart 800 shows, both the software program and the software testbench model generate stimuli for the DUT and receive responses from the DUT and operate concurrently.

Figure 9:
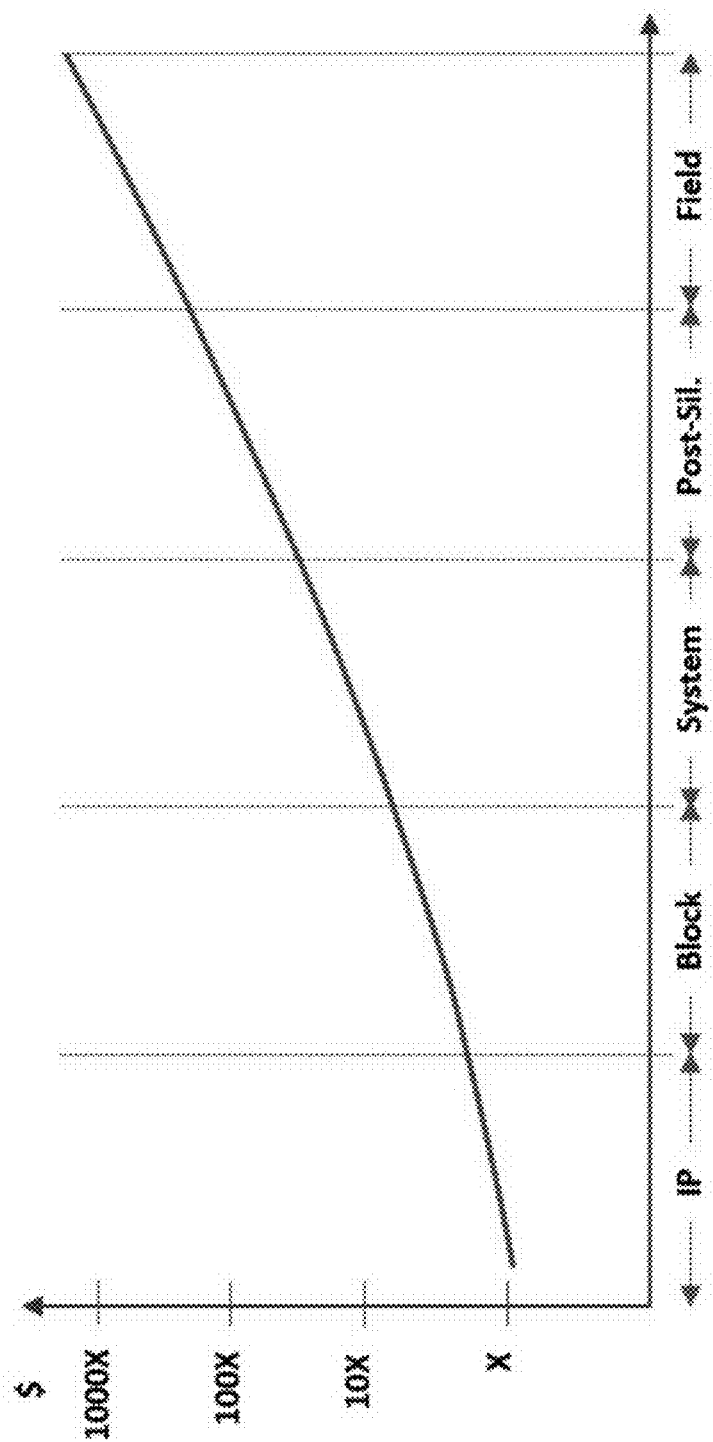
FIG. 9 illustrates the cost of bug fixing in a verification flow as charted on a logarithmic scale.

Some estimates that the cost of detecting a bug increases about ten-fold at every following stage in the verification flow, from intellectual property (IP) to block, sub-system to system level to post-silicon and finally in the field, as illustrated in FIG. 9. Therefore, the sooner a bug is found, the less expensive it is to fix. The disclosed technology allows software and hardware bugs to be detected before all of the software programs are developed and thus to speed up the whole process and to reduce the cost.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A system, comprising:
a reconfigurable hardware modeling device programmed to implement a hardware model of a circuit design;
a first computing unit configured to execute a first software program, the execution of the first software program generating first stimuli for an operation of the hardware model of the circuit design; and
a second computing unit configured to execute a testbench model of a second software program, the execution of the testbench model generating second stimuli for the operation of the hardware model of the circuit design,
wherein the first software and the second software are designed to be executed for an operation performed by a circuit manufactured according to the circuit design, and the first stimuli and the second stimuli are transmitted to the hardware model of the circuit design through a communication interface during the operation of the hardware model of the circuit design.

2. The system recited in claim 1, wherein the communication interface comprises:
a speed bridge device.

3. The system recited in claim 1, wherein the communication interface comprises:
a transactor, the transactor comprising a front-end proxy interface implemented in a computer and a back-end bus-functional model implemented in the reconfigurable hardware modeling device.

4. The system recited in claim 3, wherein the front-end proxy interface comprises:
a first sub-interface unit communicating with the first computing unit, the communicating with the first computing unit comprising receiving the first stimuli; and
a second sub-interface unit communicating with the second computing unit, the communicating with the second computing unit comprising receiving the second stimuli.

5. The system recited in claim 3, wherein the first computing unit is also implemented by the computer.

6. The system recited in claim 1, wherein the first computing unit is further configured to execute a software model of a processor, the processor being an embedded processor in an embedded system configured to execute software programs comprising the first software program and the second software program, the embedded system further comprises a chip comprising a circuit manufactured based on the circuit design.

7. The system recited in claim 1, wherein the first computing unit is further configured to execute a testbench interface program communicating with the testbench model, the communicating comprising receiving the second stimuli.

8. The system recited in claim 1, wherein the first software program comprises a testbench interface module communicating with the testbench model, the communicating comprising receiving the second stimuli.

9. The system recited in claim 1, wherein the first computing unit and the second computing unit are implemented by a single computer.

10. The system recited in claim 1, wherein the first computing unit and the second computing unit are implemented by two computers, respectively.

11. The system recited in claim 1, wherein the first computing unit is implemented using a virtual machine running on a computer.

12. The system recited in claim 11, wherein the second computing unit comprises:
a virtual machine interface program communicating with the virtual machine, the communicating comprising sending the second stimuli; and
a stimuli generation program configured to generate the second stimuli.

13. The system recited in claim 1, wherein the reconfigurable hardware modeling device is a hardware emulator or an FPGA-based prototyping device.

14. The system recited in claim 1, wherein the first computing unit, the second computing unit, or both, receive circuit responses from the hardware model of the circuit design through the communication interface.

15. A method, comprising:
implementing a hardware model of a circuit design on a reconfigurable hardware modeling device, the reconfigurable hardware modeling device and a computing environment having a communication interface, the computing environment comprising a first computing unit and a second computing unit; and
performing an operation of the hardware model of the circuit design, during the operation:

transmitting first stimuli generated by executing a first software program on the first computing unit to the hardware model of the circuit design through a communication interface, and transmitting second stimuli generated by executing a testbench model of a second software program on the second computing unit to the hardware model of the circuit design through the communication interface wherein the first software and the second software are designed to be executed for an operation performed by a circuit manufactured according to the circuit design.

16. The method recited in claim 15, wherein the communication interface comprises:

a speed bridge device.

17. The method recited in claim 15, wherein the communication interface comprises:

a transactor, the transactor comprising a front-end proxy interface implemented in a computer and a back-end bus-functional model implemented in the reconfigurable hardware modeling device.

18. The method recited in claim 17, wherein the front-end proxy interface comprises:

a first sub-interface unit communicating with the first computing unit, the communicating with the first computing unit comprising receiving the first stimuli; and a second sub-interface unit communicating with the second computing unit, the communicating with the second computing unit comprising receiving the second stimuli.

19. The method recited in claim 15, wherein the first computing unit is further configured to execute a testbench interface program communicating with the testbench model, the communicating comprising receiving the second stimuli.

20. The method recited in claim 15, wherein the first software program comprises a testbench interface module communicating with the testbench model, the communicating comprising receiving the second stimuli.

21. The method recited in claim 15, wherein the first computing unit is implemented using a virtual machine running on a computer.

22. The method recited in claim 21, wherein the second computing unit comprises:

a virtual machine interface program communicating with the virtual machine, the communicating comprising sending the second stimuli; and a stimuli generation program configured to generate the second stimuli.

23. The method recited in claim 15, wherein the reconfigurable hardware modeling device is a hardware emulator or an FPGA-based prototyping device.

* * * * *